(12) United States Patent
Ono et al.

(10) Patent No.: US 8,673,742 B2
(45) Date of Patent: Mar. 18, 2014

(54) METHOD FOR MANUFACTURING SEMICONDUCTOR DEVICE

(75) Inventors: Katsumi Ono, Tokyo (JP); Masato Negishi, Tokyo (JP); Masato Suzuki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/588,119

(22) Filed: Aug. 17, 2012

(65) Prior Publication Data
US 2013/0143388 A1    Jun. 6, 2013

(30) Foreign Application Priority Data

Dec. 6, 2011 (JP) ................................. 2011-266457

(51) Int. Cl.
*H01L 21/46* (2006.01)
*H01L 21/78* (2006.01)
*H01L 21/301* (2006.01)

(52) U.S. Cl.
USPC ............ 438/462; 257/E21.238; 257/E21.599; 438/460; 438/463

(58) Field of Classification Search
USPC ........... 257/E21.238, E21.599; 438/460, 462, 438/463
See application file for complete search history.

(56) References Cited

U.S. PATENT DOCUMENTS

2011/0300691 A1* 12/2011 Sakamoto et al. ............ 438/462

FOREIGN PATENT DOCUMENTS

| JP | 5-66999 U | 9/1993 |
| JP | 11-274653 A | 10/1999 |
| JP | 2007-317935 A | 12/2007 |
| JP | 2008-311547 A | 12/2008 |

OTHER PUBLICATIONS

Korean Patent Office, Office Action in Korean Patent Application No. 10-2012-0132811 (Sep. 25, 2013).

* cited by examiner

*Primary Examiner* — Asok K Sarkar
(74) *Attorney, Agent, or Firm* — Leydig, Voit & Mayer, Ltd.

(57) ABSTRACT

A method for manufacturing a semiconductor device includes forming a starting-point crack on a cleavage line on a surface of a semiconductor substrate; forming preliminary cracks intermittently along the cleavage line on the surface of the semiconductor substrate; and cleaving the semiconductor substrate along the cleavage line passing through the preliminary cracks, from the starting-point crack, wherein each of the preliminary cracks has a crack joining the cleavage line from outside of the cleavage line, in a direction of a progress of cleaving.

9 Claims, 2 Drawing Sheets

METHOD FOR MANUFACTURING SEMICONDUCTOR DEVICE

BACKGROUND OF THE INVENTION

1. Field of the Invention

The present invention relates to a method for cleaving a compound semiconductor substrate for laser diode or the like. In particular, the present invention relates to a method for manufacturing a semiconductor device capable of alleviating the divergence of cleavages from a desired cleavage line.

2. Background Art

A semiconductor substrate is formed from a sliced single crystal; the single crystal has a readily isolating cleavage plane. Therefore, when a substrate is cleaved, a scribe line is first formed on one side or both sides of the substrate along a cleavage plane using a diamond-point tool or the like. Directly under the scribe line, micro-cracks (minute cracks) are formed. Next, stress is applied to the substrate to open the micro-cracks along the cleaved plane. Thereby, the substrate can be separated while forming a cleaved plane having atomic-level smoothness (for example, refer to Japanese Patent Application Laid-Open No. 11-274653 (pages 2 to 3, FIGS. 3 to 8)).

SUMMARY OF THE INVENTION

A semiconductor element, such as a laser diode formed on a substrate, is formed by depositing and patterning heterogeneous material layers, which are composed of materials different from that of the substrate. The heterogeneous material layer may have a cleavage plane different from the substrate. In such a case, a cleavage may progress in the heterogeneous material layer in the direction different from that of the substrate.

Furthermore, patterns for the semiconductor element are formed along the cleavage planes of the substrate. However, due to unavoidable errors, the direction of a pattern may slightly diverge from the direction of the cleavage plane of the substrate. The divergence may accumulate as the cleavage increases, and the pattern may be separated into shapes that cannot operate as the element.

Moreover, the substrate is urged upward by a knife-like part from the back for creating a cleavage. However, the longitudinal axis of the part may slightly diverge from the cleavage plane of the substrate, and the cleavage may progress along the longitudinal axis of the part. The resultant cleavage may significantly diverge from the desired cleavage line, resulting in elements having unsatisfactory product performance and lower productivity.

In view of the above-described problems, an object of the present invention is to provide a method for manufacturing a semiconductor device capable of alleviating the divergence of cleavages from a desired cleavage line.

According to the present invention, a method for manufacturing a semiconductor device includes: forming a starting-point crack on a desired cleavage line on a surface of a semiconductor substrate; forming a plurality of preliminary cracks intermittently along the desired cleavage line on the surface of the semiconductor substrate; and cleaving the semiconductor substrate along the desired cleavage line passing through the plurality of preliminary cracks from the starting-point crack, wherein each of the preliminary cracks has a crack joining the desired cleavage line from outside of the desired cleavage line in a direction of a progress of a cleavage.

The present invention makes it possible to alleviate the divergence of cleavages from a desired cleavage line.

Other and further objects, features and advantages of the invention will appear more fully from the following description.

DETAILED DESCRIPTION OF THE PREFERRED EMBODIMENTS

A method for manufacturing a semiconductor device according to the embodiments of the present invention will be described with reference to the drawings. The same components will be denoted by the same symbols, and the repeated description thereof may be omitted.

First Embodiment

Figure 1:
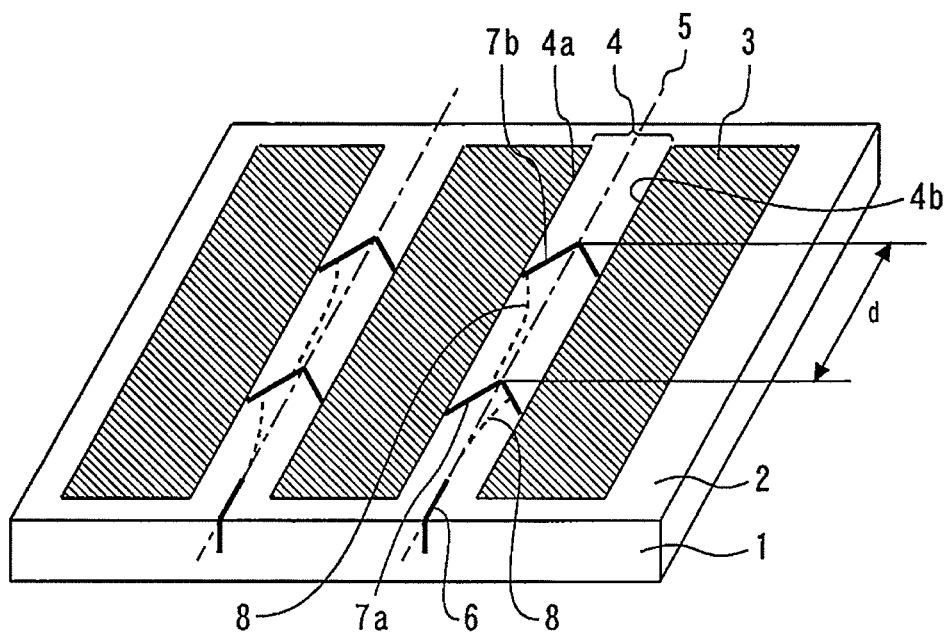
FIG. 1 is a perspective view showing a method for manufacturing a semiconductor device according to the first embodiment of the present invention.

FIG. 1 is a perspective view showing a method for manufacturing a semiconductor device according to the first embodiment of the present invention. On the surface 2 of the semiconductor substrate 1, although details are not shown in the drawing, heterogeneous material layers formed of materials different from the semiconductor substrate 1 are deposited, and semiconductor elements 3 have been formed in regular patterns in the preceding process. Between adjacent semiconductor elements 3, dicing lines 4, which are margins for cutting, are present. The center line of dicing lines 4 is the desired cleavage line 5. The cleavage cannot cross over the edges 4a and 4b of the dicing lines 4 into the semiconductor element 3.

First, on the surface of the semiconductor substrate 1, a starting-point crack 6 is formed in the end portion on the desired cleavage line 5, and in the dicing line 4, a plurality of preliminary cracks 7a and 7b are intermittently formed along the desired cleavage line 5.

The preliminary cracks 7a and 7b have V-shape in plan view, and in the direction of the progress of the cleavage, they have cracks joining the desired cleavage line 5 from the outside of the desired cleavage line 5. The preliminary cracks 7a and 7b are channels having a desired depth formed by laser, and impose a crack inducing effect as in the micro-cracks introduced in the depth direction of the semiconductor substrate 1 by a point scriber.

Next, by urging upward the semiconductor substrate 1 from the back with an up-thrust part, the semiconductor substrate 1 is cleaved along the desired cleavage line 5 passing through a plurality of preliminary cracks 7a and 7b from the starting-point cracks 6.

Here, due to the effect of the above-described heterogeneous material layers, the divergence between the directions of patterns of the semiconductor elements 3 and the semiconductor substrate 1 in the cleavage plane, the divergence of the longitudinal axis of the up-thrust part from the cleavage plane of the semiconductor substrate 1, or the like, the cleavages 8 diverge from the desired cleavage lines 5. The diverged cleavages 8 collide with the preliminary cracks 7a, and are guided onto the desired cleavage line 5. Even if the cleavages 8 thereafter diverge from the desired cleavage line 5, the cleavages 8 are guided onto the desired cleavage line 5 by the preliminary cracks 7b. By the repetition of this, the progress of the cleavages 8 is limited in the dicing line 4. Therefore, the divergence of the cleavages 8 from the desired cleavage line 5 can be reduced. As a result, it is possible to prevent elements having unsatisfactory product performance from being formed, and the productivity improves.

Moreover, in the present embodiment, the preliminary cracks 7a and 7b have V-shape in plan view. Therefore, even if the cleavages 8 diverge either right or left to the desired cleavage line 5, the divergence can be reduced.

Here, if the preliminary cracks were straight lines formed on the desired cleavage line 5, the operation of a scribing apparatus could be simplified, and preliminary cracks could be easily formed. However, an incidental cleave from preliminary cracks formed on the desired cleavage line 5, which is easy to cleave, progresses simultaneously with the cleavage diverging from the direction of progress. On the point where these cleavages come to collision, a step larger than the atomic level is formed. The position of the step varies depending on the direction of progress of the cleavage from the starting-point crack 6, or the amount of progress of the cleavage from the preliminary cracks. The step may be formed in the vicinity of the active layer of the laser diode, and the characteristics of the element may be deteriorated. In contrast, the preliminary cracks 7a and 7b in the present embodiment are not formed on the desired cleavage line 5 easy to cleave, such problems are less likely to occur.

In addition, the correction capability for the divergence of crack progression is improved when the distance d between the preliminary cracks 7a and 7b is narrower. However, since the direction of the preliminary cracks 7a and 7b formed is different from the cleaving direction of the semiconductor substrate 1, the surface may be roughened in the area of the preliminary cracks 7a and 7b, and the atomic-level flatness cannot be obtained. Therefore, it is desirable that the distance d between the preliminary cracks 7a and 7b is adequately widened to secure the range for cleaving along the cleavage plane of the semiconductor substrate 1.

Second Embodiment

Figure 2:
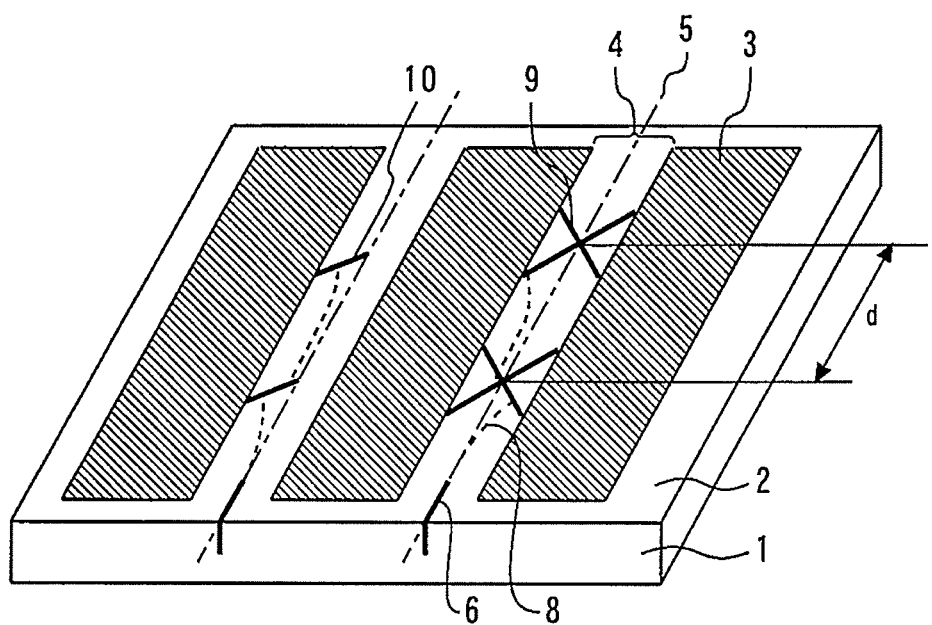
FIG. 2 is a perspective view showing the method for manufacturing the semiconductor device according to the second embodiment of the present invention.

FIG. 2 is a perspective view showing the method for manufacturing the semiconductor device according to the second embodiment of the present invention. The preliminary cracks 9 have X-shape in plan view. The preliminary cracks 10 are diagonal to the desired cleavage line 5 in plan view.

In the direction of the progress of the cleavage, the preliminary cracks 9 and 10 have cracks joining the desired cleavage line 5 from the outside of the desired cleavage line 5. Therefore, in the same manner as in the first embodiment, the divergence of the cleavages 8 from the desired cleavage line 5 can be reduced.

With the preliminary cracks 9 and 10, since it is not required to accurately form the intersection point to be V-shape, the productivity improves. In addition, in the case of X-shaped preliminary cracks 9, even if the cleavages 8 are diverge either right or left to the desired cleavage line 5, the divergence can be reduced. However, in the case of the preliminary cracks 9, the cleavages 8 may overrun from the desired cleavage line 5.

On the other hand, in the case of preliminary cracks 10 of diagonal straight lines, such an overrun is less likely to occur. However, since the preliminary cracks 10 are formed on either one of right and left of the desired cleavage line 5, the direction in which the cleavages 8 diverge must be predicted. If the cleavages 8 diverge to the opposite side from the preliminary cracks 10, the divergence of the cleavages 8 cannot be reduced.

Third Embodiment

Figure 3:
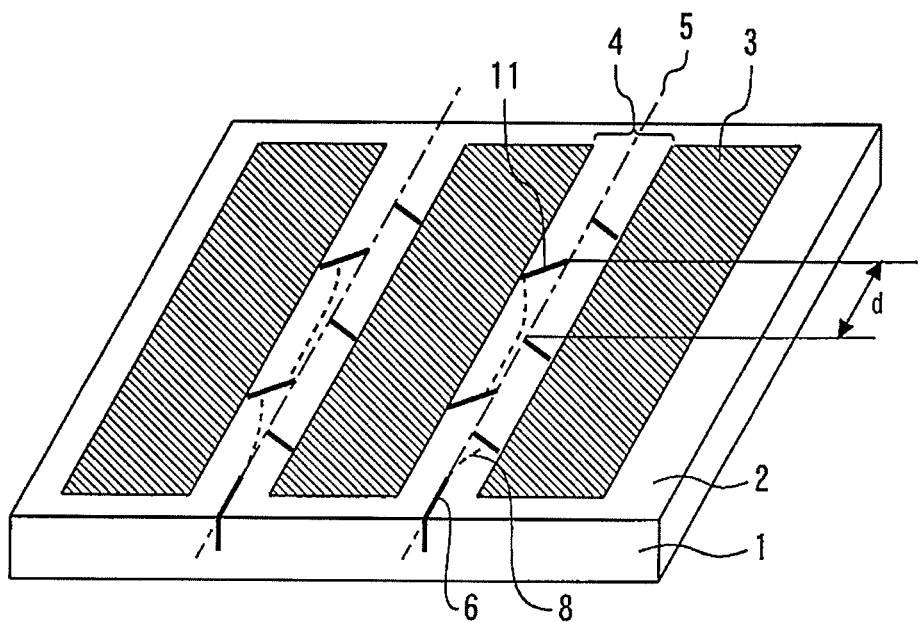
FIG. 3 is a perspective view showing the method for manufacturing the semiconductor device according to the third embodiment of the present invention.

FIG. 3 is a perspective view showing the method for manufacturing the semiconductor device according to the third embodiment of the present invention. The preliminary cracks 11 are diagonal straight lines to the desired cleavage line 5 in plan view, and join to the desired cleavage line 5 in the direction of the progress of the cleavage from the outside of the desired cleavage line 5. Therefore, in the same manner as in the first embodiment, the divergence of the cleavage from the desired cleavage line can be reduced.

Furthermore, a plurality of preliminary cracks 11 are alternately located on the right and left to the desired cleavage line 5. Therefore, even if the cleavages diverge either right or left to the desired cleavage line 5, the divergence can be reduced. However, when the cleavages progress to the opposite side from the preliminary cracks 11, the divergence will be corrected by the next preliminary cracks 11. Accordingly, the distance d must be narrowed in comparison with V-shaped preliminary cracks 7a and 7b. Therefore, the size of the cleavage plane having the atomic level flatness is reduced.

In the above-described first to third embodiments, although preliminary cracks 7a, 7b, 9, 10, and 11 are formed by forming channels by laser, any other methods may be used, and an internal modified layer may be formed by laser, scratch marks may be formed on the surface 2 of the semiconductor substrate 1 using a diamond point or the like, or when the semiconductor element 3 is formed on the surface 2 of the semiconductor substrate 1, a physical channel may be formed.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-266457, filed on Dec. 6, 2011, including specification, claims, drawings, and summary, on which the Convention priority of the present application is based, is incorporated herein by reference in its entirety.

What is claimed is:

1. A method for manufacturing a semiconductor device comprising:
    forming a starting-point crack on a linear cleavage line on a surface of a semiconductor substrate;
    forming a plurality of spaced-apart linear preliminary cracks, in the surface of the semiconductor substrate, oblique to and intersecting the cleavage line; and
    cleaving the semiconductor substrate along the cleavage line, starting from the starting-point crack and continuing along the cleaving line so that the cleaving passes through at least some of the preliminary cracks, wherein each of the preliminary cracks extends generally toward a direction of progress of the cleaving of the semiconductor substrate starting from the starting-point crack.

2. The method for manufacturing a semiconductor device according to claim 1, wherein each of the preliminary cracks has two linear portions that form a V-shape in a plan view, perpendicular to the surface of the semiconductor substrate.

3. The method for manufacturing a semiconductor device according to claim 1, wherein each of the preliminary cracks has two linear portions that form an X-shape in a plan view, perpendicular to the surface of the semiconductor substrate.

4. The method for manufacturing a semiconductor device according to claim 1, wherein the preliminary cracks are alternately located on opposite sides of the cleavage line, along the cleavage line, from the starting-point crack in the direction of the progress of the cleaving.

5. A method for manufacturing a semiconductor device comprising:
   forming a plurality of mutually spaced apart semiconductor elements on the surface of a semiconductor substrate, wherein
      closest pairs of the semiconductor elements are separated on the surface of the semiconductor substrate by linear dicing lines that extend to edges of the substrate,
      each dicing line has a linear center line that is substantially parallel to a crystalline plane of the semiconductor substrate along which the semiconductor substrate is to be cleaved to separate the semiconductor elements from each other, and
      each dicing line has linear first and second margins, on opposite sides of the center line of the dicing line, and contiguous to respective semiconductor elements;
   forming a starting-point crack on a center line of a first dicing line of the dicing lines, on the surface of the semiconductor substrate, at one of the edges of the semiconductor substrate;
   forming a plurality of linear preliminary cracks in the surface of the semiconductor substrate so that
      each preliminary crack lies within the first dicing line,
      each preliminary crack extends from a respective first point on one of the first and second margins of the first dicing line to a respective second point on the center line of the first dicing line,
      each preliminary crack is oblique to the first and second margins and center line of the first dicing line, and
      respective second points of the preliminary cracks are farther from the starting point crack than are the respective first points of the preliminary cracks, whereby the preliminary cracks are directed toward a direction of propagation of cleaving of the semiconductor substrate from the starting point crack and along the center line of the first dicing line; and
   cleaving the semiconductor substrate along the center line of the dicing line, beginning from the starting-point crack.

6. The method for manufacturing a semiconductor device according to claim 5, including forming the preliminary cracks in the surface of the semiconductor substrate so that respective pairs of the preliminary cracks intersect at the center line of the first dicing line and the intersecting preliminary cracks form a V-shape in a plan view taken perpendicular to the surface of the semiconductor substrate.

7. The method for manufacturing a semiconductor device according to claim 5, including forming the preliminary cracks at alternating locations along and on opposite sides of the center line of the first dicing line so that none of the preliminary cracks intersects another preliminary crack.

8. A method for manufacturing a semiconductor device comprising:
   forming a plurality of mutually spaced apart semiconductor elements on the surface of a semiconductor substrate, wherein
      closest pairs of the semiconductor elements are separated on the surface of the semiconductor substrate by linear dicing lines that extend to edges of the substrate,
      each dicing line has a linear center line that is substantially parallel to a crystalline plane of the semiconductor substrate along which the semiconductor substrate is to be cleaved to separate the semiconductor elements from each other, and
      each dicing line has linear first and second margins on opposite sides of the center line of the dicing line, and contiguous to respective semiconductor elements;
   forming a starting-point crack on a center line of a first dicing line of the dicing lines, on the surface of the semiconductor substrate, at one of the edges of the semiconductor substrate;
   forming a plurality of linear preliminary cracks in the surface of the semiconductor substrate so that
      each preliminary crack lies within the first dicing line,
      each preliminary crack extends from and between the first and second margins of the first dicing line, crossing the center line of the first dicing line, and
      each preliminary crack is oblique to the first and second margins and the center line of the first dicing line; and
   cleaving the semiconductor substrate along the center line of the first dicing line, beginning from the starting-point crack.

9. The method for manufacturing a semiconductor device according to claim 8, including forming the preliminary cracks in the surface of the semiconductor substrate so that each preliminary crack intersects another preliminary crack at the center line of the first dicing line and each intersecting pair of preliminary cracks forms an X-shape in a plan view taken perpendicular to the surface of the semiconductor substrate.

* * * * *